United States Patent
Chindo

(10) Patent No.: US 8,614,605 B2
(45) Date of Patent: *Dec. 24, 2013

(54) GAS CELL UNIT, ATOMIC OSCILLATOR AND ELECTRONIC APPARATUS

(75) Inventor: Koji Chindo, Saitama (JP)

(73) Assignee: Seiko Epson Corporation (JP)

( * ) Notice: Subject to any disclaimer, the term of this patent is extended or adjusted under 35 U.S.C. 154(b) by 1 day.

This patent is subject to a terminal disclaimer.

(21) Appl. No.: 13/418,681

(22) Filed: Mar. 13, 2012

(65) Prior Publication Data

US 2012/0235755 A1 Sep. 20, 2012

(30) Foreign Application Priority Data

Mar. 14, 2011 (JP) ................... 2011-055656

(51) Int. Cl.
*H03B 17/00* (2006.01)
*H01S 1/06* (2006.01)

(52) U.S. Cl.
USPC .............................. 331/94.1; 331/3

(58) Field of Classification Search
USPC ...................................... 331/94.1, 3
See application file for complete search history.

(56) References Cited

U.S. PATENT DOCUMENTS

| 5,387,881 | A  | * | 2/1995 | Schweda et al. ............. 331/94.1 |
| 6,806,784 | B2 |   | 10/2004 | Hollberg et al. |
| 6,812,800 | B2 | * | 11/2004 | Matsuura et al. ............. 331/94.1 |
| 2006/0002276 | A1 |   | 1/2006 | Maruyama et al. |
| 2006/0022761 | A1 |   | 2/2006 | Abeles et al. |
| 2009/0315629 | A1 |   | 12/2009 | Chindo et al. |

FOREIGN PATENT DOCUMENTS

JP         10-284772     10/1998
JP         2010-028794    2/2010

* cited by examiner

*Primary Examiner* — Joseph Chang
(74) *Attorney, Agent, or Firm* — Harness, Dickey & Pierce, P.L.C.

(57) ABSTRACT

A gas cell unit has a gas cell, inside which gaseous metallic atoms are sealed a first heater that heats the gas cell, and a second heater that is provided to face the first heater via the gas cell and heats the gas cell. The heaters include a first heating resistor and a second heating resistor which are provided so as to face each other, are heated by electric current flow, and mutually offset the magnetic fields generated along with the electric current flow.

9 Claims, 14 Drawing Sheets

GAS CELL UNIT, ATOMIC OSCILLATOR AND ELECTRONIC APPARATUS

BACKGROUND

1. Technical Field

The present invention relates to a gas cell unit, an atomic oscillator, and an electronic apparatus.

2. Related Art

Generally, atomic oscillators, which oscillate based on the energy transfer of the atoms of an alkali metal such as rubidium and cesium, are broadly classified into an oscillator which uses a double resonance phenomenon due to light and microwaves (for example, see JP-A-10-284772) and an oscillator which uses a quantum interference effect (CPT: Coherent Population Trapping) due to two types of light having different wavelengths (for example, see U.S. Pat. No. 6,806,784).

In any atomic oscillator, generally, in order to seal the alkali metal in a gas cell together with a buffer gas and keep the alkali metal in a gaseous state, there is a need to heat the gas cell to a predetermined temperature.

For example, in the atomic oscillator described in U.S. Patent Publication No. 2006-0022761, a film-like heating element formed of ITO is provided on an outer surface of a gas cell, inside which gaseous metallic atoms are sealed, and the heating element is heated by electric current flow. As a result, it is possible to heat the gas cell and keep the metallic atoms in the gas cell in a gaseous state.

In such an atomic oscillator, generally, the electric current to be supplied to the heating element is regulated so that the temperature in the gas cell is constant. For that reason, for example, along with a change in the ambient air temperature, the electric current flowing through the heating element changes.

In this manner, when the electric current flowing through the heating element changes, the magnetic field generated from the heating element also changes.

When the magnetic field generated from the heating element changes, the frequency fluctuates corresponding to the energy difference between ground levels of the metallic atoms in the gas cell. For that reason, in the atomic oscillator of the related art, there is a problem in that the output frequency deviates.

SUMMARY

An advantage of some aspects of the invention is to provide a gas cell unit, an atomic oscillator, and an electronic apparatus capable of improving frequency accuracy.

Application Example 1

This application example of the invention is directed to a gas cell unit that includes a gas cell; and a first heater which has a first resistor and a second resistor, and heats the gas cell, wherein the first resistor and the second resistor are connected to each other, the first resistor and the second resistor are placed on a surface of the gas cell in a superimposed manner, and the direction of the electric current flowing through the first resistor is opposite to the direction of the electric current flowing through the second resistor.

As a result, even when the amount of current flow to a heater (specifically, the first heating resistor and the second heating resistor) fluctuates, it is possible to suppress or prevent a change in the magnetic field in the gas cell. For that reason, it is possible to keep the temperature in the gas cell at a desired temperature while suppressing changes in the magnetic field in the gas cell. As a consequence, the gas cell unit of the application example of the invention is able to improve the frequency accuracy.

Application Example 2

It is preferable that the gas cell unit of the application example of the invention includes a second heater having the same configuration as that of the first heater, and have a configuration in which the gas cell is interposed between the first heater and the second heater.

As a result, even when amounts of current flow to the first heater and the second heater (specifically, the first heating resistor and the second heating resistor) fluctuate, respectively, it is possible to suppress or prevent changes in the magnetic field in the gas cell. For that reason, it is possible to keep the temperature in the gas cell at a desired temperature while suppressing changes in the magnetic field in the gas cell. As a consequence, the gas cell unit of the application example of the invention is able to improve the frequency accuracy.

Application Example 3

In the gas cell unit of the application example of the invention, it is preferable that the first heater or the second heater have a substrate, the first resistor be provided on one surface side and the second resistor on the other surface side of the substrate, and that the first resistor come into contact with the surface of the gas cell.

As a result, it is possible to reduce the distance between the first heating resistor and the second heating resistor while preventing a short circuit between the first heating resistor and the second heating resistor. For that reason, it is possible to effectively mutually offset the magnetic fields generated from the first heating resistor and the second heating resistor.

Application Example 4

In the gas cell unit of the application example of the invention, it is preferable that the first resistor be bonded to one surface of the substrate, and the second resistor be bonded to the other surface of the substrate.

As a result, installation of the first heating resistor is facilitated.

Application Example 5

In the gas cell unit of the application example of the invention, it is preferable that the first resistor be bonded to the surface of the gas cell, and the second resistor be bonded to the other surface of the substrate.

As a result, it is possible to prevent a gap being generated between the first heating resistor and the gas cell. For that reason, the gas cell can be uniformly and effectively heated. Furthermore, the installation of the second heating resistor made easy. Furthermore, it is possible to accurately regulate the distance between the first heating resistor and the second heating resistor by the thickness of the substrate.

Application Example 6

In the gas cell unit of the application example of the invention, it is preferable that the direction of the electric current flowing through the first resistor of the first heater be the same as the direction of the electric current flowing through the first resistor of the second heater.

As a result, it is possible to mutually offset the magnetic fields generated from the first heating resistor of the first heater and the first heating resistor of the second heater in the gas cell.

Application Example 7

In the gas cell unit of the application example of the invention, the first and the second resistors may have a configuration having a plurality of band-like portions, and the band-like portions may be juxtaposed at intervals with one another.

As a result, it is possible to set the heating amount and heating distribution or the like, the first and second heating resistors depending in the width, pitch, and length or the like of the plurality of band-like portions.

Application Example 8

In the gas cell unit of the application example of the invention, it is preferable that, in the plurality of band-like portions, the directions of the electric currents flowing through the band-like portions adjacent to each other be opposite to each other.

As a result, it is possible to offset the magnetic fields generated from the band-like portions adjacent to each other.

Application Example 9

This application example of the invention is directed to an atomic oscillator that includes the gas cell unit of the application example of the invention; a light emitting portion which emits an excitation light exciting alkali metal atoms in the gas cell; and an optical detecting portion which detects intensity of the excitation light transmitted through the gas cell.

As a result, it is possible to provide an atomic oscillator having excellent frequency accuracy.

Application Example 10

This application example of the invention is directed to an electronic apparatus which includes the atomic oscillator according to Application Example 9 of the invention.

As a result, it is possible to provide an electronic apparatus having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a gas cell unit, an atomic oscillator, and an electronic apparatus according to the invention will be described in detail based on embodiments shown in the accompanying drawings.

First Embodiment

Figure 1:
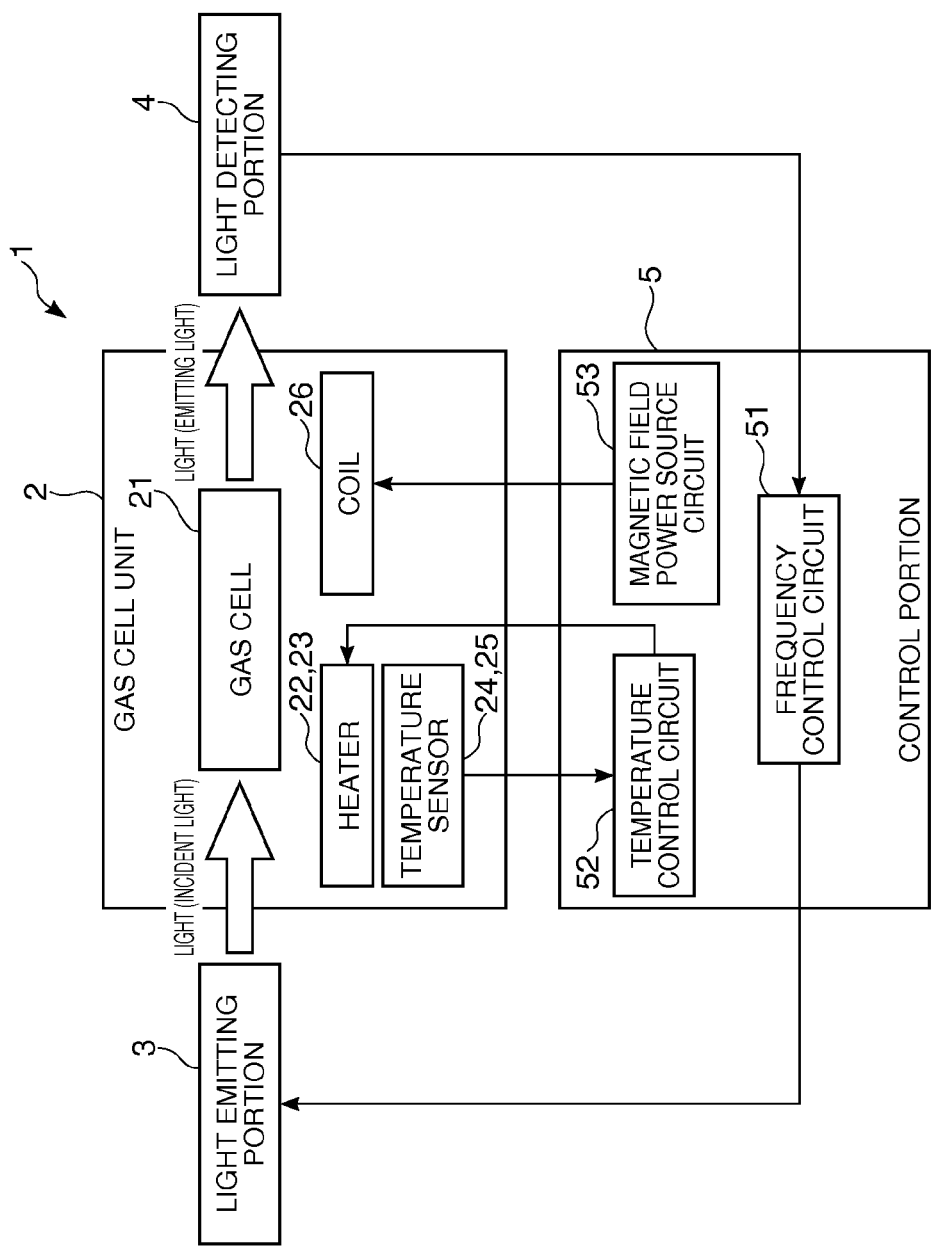
FIG. 1 is a block diagram that shows a schematic configuration of an atomic oscillator according to a first embodiment of the invention.
Figure 2:
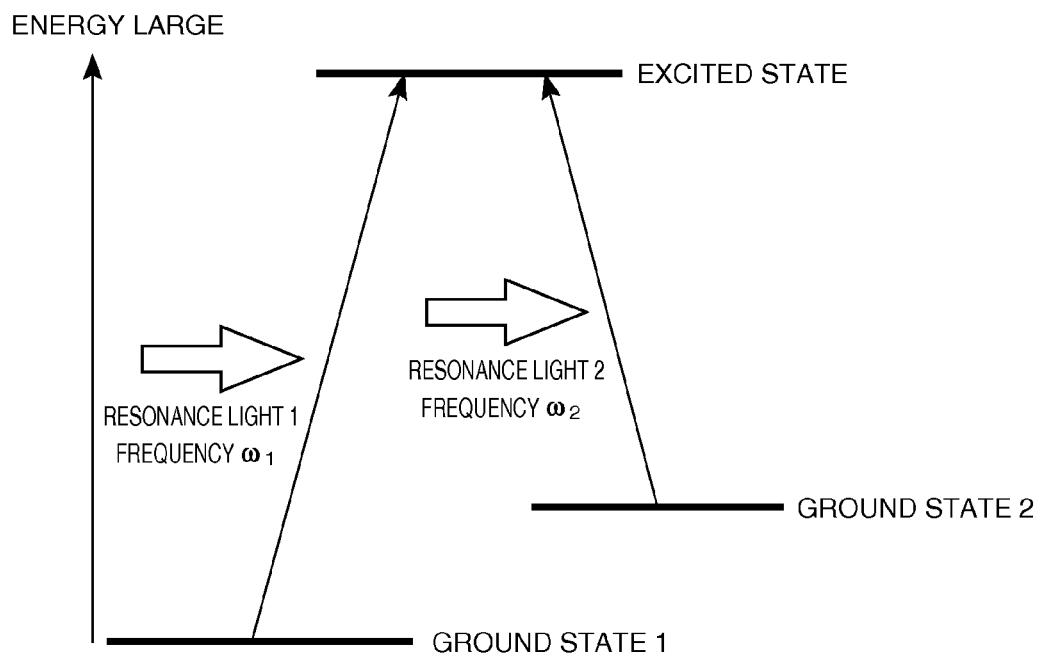
FIG. 2 is a diagram describing the energy state of an alkali metal in a gas cell included in the atomic oscillator shown in FIG. 1.
Figure 3:
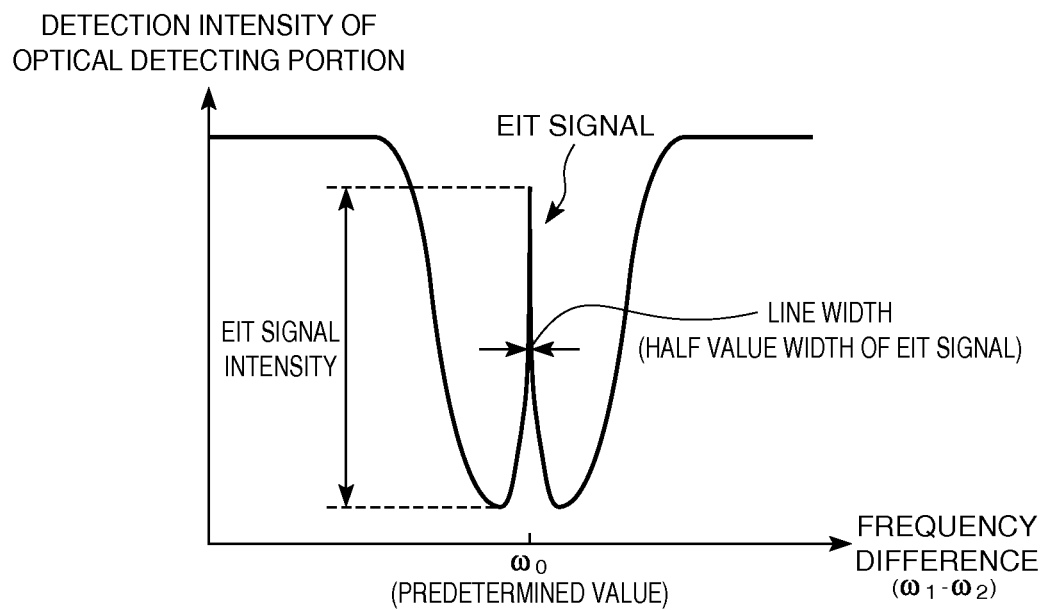
FIG. 3 is a graph that shows the relationship between the frequency difference of two lights from a light emitting portion and a detection intensity of the light detecting portion in the light emitting portion and the light detecting portion included in the atomic oscillator shown in FIG. 1.
Figure 4:
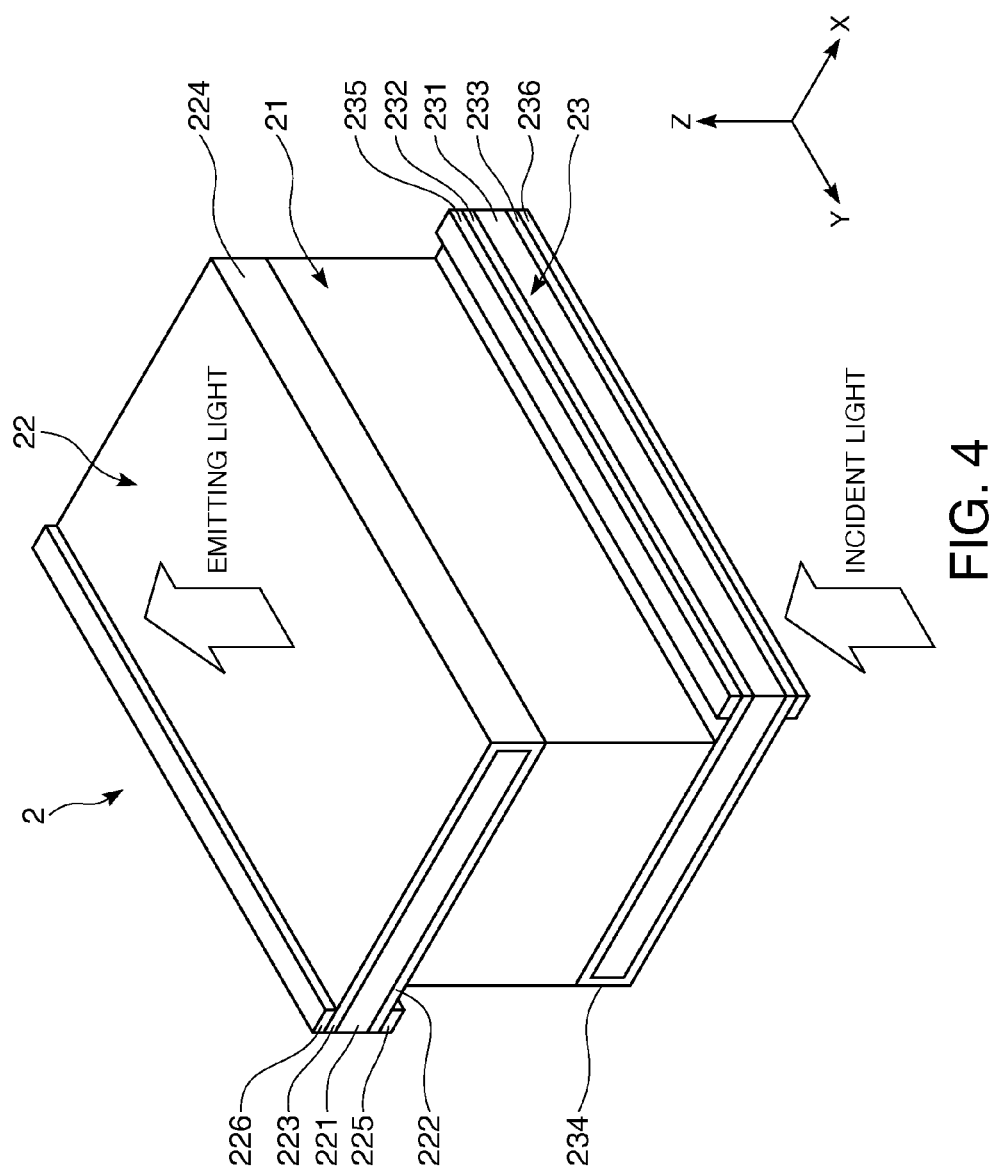
FIG. 4 is a perspective view that shows a schematic configuration of a gas cell unit included in the atomic oscillator shown in FIG. 1.
Figure 5:
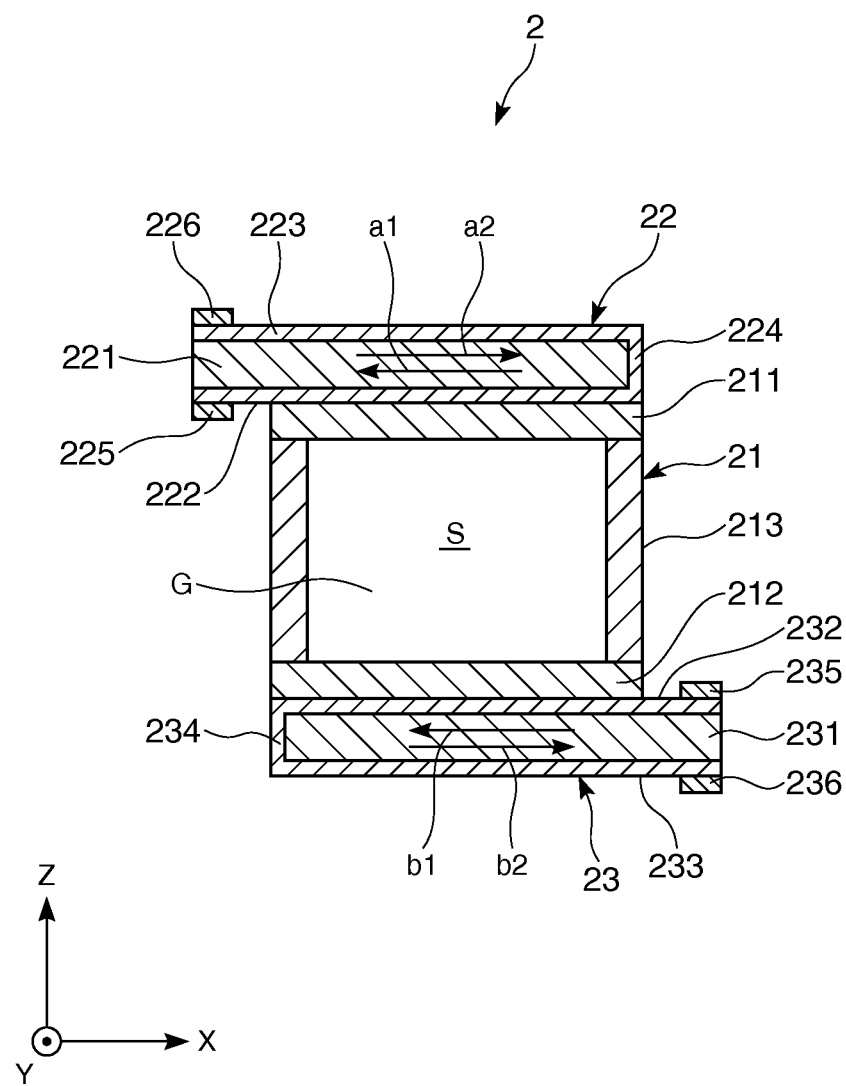
FIG. 5 is a cross-sectional view that shows the gas cell unit shown in FIG. 4.

FIG. 1 is a block diagram that shows a schematic configuration of an atomic oscillator according to a first embodiment of the invention. FIG. 2 is a diagram for describing an energy state of an alkali metal in a gas cell included in the atomic oscillator shown in FIG. 1. FIG. 3 is a graph that shows the relationship between a frequency difference of two lights from a light emitting portion and a detection intensity of an optical detecting portion in the light emitting portion and the optical detecting portion included in the atomic oscillator shown in FIG. 1. FIG. 4 is a perspective view that shows a schematic configuration of a gas cell unit included in the atomic oscillator shown in FIG. 1. FIG. 5 is a cross-sectional view that shows the gas cell unit shown in FIG. 4. In addition, hereinafter, for convenience of explanation, the upper side of FIGS. 4 and 5 is "up" and the lower side thereof is "down". Furthermore, in FIGS. 4 and 5, for convenience of explanation, as three axes perpendicular to each other, an X axis, a Y axis and a Z axis are shown, the direction parallel to the X axis is the "X axis direction", the direction parallel to the Y axis is the "Y axis direction", and the direction (an up and down direction) parallel to the Z axis is the "Z axis direction".

Atomic Oscillator

Firstly, an overall configuration of the atomic oscillator according to the present embodiment will be briefly described based on FIGS. 1 to 3.

In addition, hereinafter, a case will be described as an example where the invention is applied to an atomic oscillator using a quantum interference effect. However, the invention can also be applied to an atomic oscillator using a double resonance effect, without being limited thereto.

The atomic oscillator 1 shown in FIG. 1 has a gas cell unit 2, a light emitting portion 3, an optical detecting portion 4, and a control portion 5.

Furthermore, the gas cell unit 2 has a gas cell 21 sealed with a gaseous alkali metal, heaters 22 and 23 that heat the gas cell 21, temperature sensors 24 and 25 that detect the temperature of the gas cell 21, and a coil 26 that generates a magnetic field acting on the gas cell 21.

Alkali metals such as gaseous rubidium, cesium, and sodium are sealed in an inner portion of the gas cell 21.

As shown in FIG. 2, the alkali metal has an energy level of a three-level system, and obtains three states of two ground states (ground states 1 and 2) having different energy levels and an excited state. Herein, the ground state 1 has an energy state lower than that of the ground state 2.

When two types of resonance lights 1 and 2 having the different frequencies to the gaseous alkali metal are irradiated to the gaseous alkali metal as mentioned above, an optical absorptivity (an optical transmittance) in the alkali metal of the resonance lights 1 and 2 changes depending on the difference ($\omega 1 - \omega 2$) between a frequency $\omega 1$ of the resonance light 1 and a frequency $\omega 2$ of the resonance light 2.

Moreover, when the difference ($\omega 1 - \omega 2$) between the frequency $\omega 1$ of the resonance light 1 and the frequency $\omega 2$ of the resonance light 2 coincides with the frequency corresponding to an energy difference between the ground state 1 and the ground state 2, excitations from the ground states 1 and 2 to the excited state are stopped, respectively. At this time, both of the resonance lights 1 and 2 are not absorbed by the alkali metal but are transmitted therethrough. Such a phenomenon is called a CPT phenomenon or an electromagnetically induced transparency phenomenon (EIT: Electromagnetically Induced Transparency).

The light emitting portion 3 emits the excited light that excites the alkali metal atoms in the gas cell 21.

More specifically, the light emitting portion 3 emits two types of light (the resonance light 1 and the resonance light 2) having different frequencies.

The frequency $\omega 1$ of the resonance light 1 is able to excite the alkali metal in the gas cell 21 from the ground state 1 mentioned above to the excited state.

Furthermore, the frequency $\omega 2$ of the resonance light 2 is able to excite the alkali metal in the gas cell 21 from the ground state 2 mentioned above to the excited cite.

The light detecting portion 4 detects the intensities of the resonance lights 1 and 2 transmitted through the gas cell 21.

For example, if the light emitting portion 3 fixes the frequency $\omega 1$ of the resonance light 1 and changes the frequency $\omega 2$ of the resonance light 2, when the difference ($\omega 1 - \omega 2$) between the frequency $\omega 1$ of the resonance light 1 and the frequency $\omega 2$ of the resonance light 2 coincides with a frequency $\omega 0$ corresponding to an energy difference between the ground state 1 and the ground state 2, as shown in FIG. 3, the detection intensity of the light detecting portion 4 steeply rises. The steep signal is detected as an EIT signal. The EIT signal has an eigenvalue defined by the kind of alkali metal. Thus, the oscillator can be configured by using such an EIT signal.

The control portion 5 has a function of controlling the heaters 22 and 23 and the light emitting portion 3.

The control portion 5 has a frequency control circuit 51 that controls the frequencies of the resonance lights 1 and 2 of the light emitting portion 3, a temperature control circuit 52 that controls the temperature of the alkali metal in the gas cell 21, and a magnetic field power source circuit 53 that controls the magnetic field to be applied to the gas cell 21.

The frequency control circuit 51 controls the frequencies of the resonance lights 1 and 2 to be emitted from the light emitting portion 3 based on the detection result of the light detecting portion 4 mentioned above. More specifically, the frequency control circuit 51 controls the frequencies of the resonance lights 1 and 2 to be emitted from the light emitting portion 3 such that the difference ($\omega 1 - \omega 2$) detected by the light detecting portion 4 mentioned above becomes the specific frequency $\omega 0$ of the alkali metal mentioned above.

Furthermore, the temperature control circuit 52 controls the current flow to the heaters 22 and 23 based on the detection result of the temperature sensors 24 and 25.

Furthermore, the magnetic field power source circuit 53 controls the current flow to the coil 26 such that the magnetic field generated by the coil 26 is constant.

Gas Cell Unit

Next, the gas cell unit 2 will be described.

As shown in FIG. 4, the gas cell unit 2 has a gas cell 21, and a pair of heaters 22 and 23 provided so as to interpose the gas cell 21 therebetween.

Gas Cell

The gas cell 21 has a pair of plate-like portions 211 and 212, and a spacer 213 provided therebetween.

The plate-like portions 211 and 212 have transparency to the excitation light from the light emitting portion 3, respectively. In the present embodiment, the excitation light incident into the gas cell 21 is transmitted through the plate-like portion 212, and the excitation light emitted from the inner portion the gas cell 21 is transmitted through the plate-like portion 211.

In the present embodiment, the plate-like portions 211 and 212 both form a plate shape. Furthermore, the plate-like portions 211 and 212 form quadrangle form when viewed from the plane. In addition, for example, the shapes of the plate-like portions 211 and 212 are not limited to the shape mentioned above, but may for example form a circular shape when seen in a plan view.

The material forming the plate-like portions 211 and 212 is not particularly limited if the same has transparency to the excitation light as mentioned above, but a glass material, crystal or the like are adopted.

Furthermore, the spacer 213 forms a space S between the pair of plate-like portions 211 and 212 mentioned above.

In the present embodiment, the spacer 213 forms a frame shape or a cylindrical shape, and the inner periphery and outer periphery both form a quadrangle, when seen in plan view. In addition, the shape of the spacer 213 is not limited to the shape mentioned above, and, for example, the inner periphery and the outer periphery thereof may form a circular shape, respectively, when seen in plan view.

Furthermore, the spacer 213 is bonded to the respective plate-like portions 211 and 212 in an airtight manner. As a result, it is possible to make the space S between the pair of plate-like portions 211 and 212 an airtight space. A bonding method the spacer 213 and the respective plate-like portions 211 and 212 can be determined depending on the forming materials of the spacer 213 and the respective plate-like portions 211 and 212, and although the method is not particularly limited, for example, it is possible to use a bonding method by an adhesive, a direct bonding method, an anodic bonding method or the like.

A material forming the spacer 213 is not particularly limited, but a metallic material, a resin material or the like may be used, and like the plate-like portions 211 and 212, the glass material, crystal or the like may be used.

Heater

The heaters 22 and 23 have a function of heating the gas cell 21 (more specifically, the alkali metal in the gas cell 21). As a result, a vapor pressure of the alkali metal in the gas cell 21 is kept so as to be equal to or greater than a predetermined pressure value, whereby the alkali metal can be kept in a gaseous.

In the present embodiment, the heaters 22 and 23 are provided so as to interpose the gas cell 21 therebetween, and are symmetrically (a rotation symmetry around the gas cell 21 in a cross section shown in FIG. 5) placed via the gas cell 21. In addition, in the cross section shown in FIG. 5, the heaters 22 and 23 may be placed in the cross section so as to be vertically symmetrical to each other via the gas cell 21. Furthermore, the heaters 22 and 23 may be asymmetrically placed via the gas cell 21.

The heater 22 has a substrate 221, a heating resistor (a first resistor) 222 provided on one surface (a lower surface in FIG. 5) of the substrate 221, a heating resistor (a second resistor) 223 provided on the other surface (an upper surface in FIG. 5) of the substrate 221, a conductor portion 224 that electrically connects the heating resistor 222 with the heating resistor 223, an electrode 225 provided on the heating resistor 222, and an electrode 226 provided on the heating resistor 223.

Similarly, the heater 23 has a substrate 231, a heating resistor (a first resistor) 232 provided on one surface (an upper surface in FIG. 5) of the substrate 231, a heating resistor (a second resistor) 233 provided on the other surface (an lower surface in FIG. 5) of the substrate 231, a conductor portion 234 that electrically connects the heating resistor 232 with the heating resistor 233, an electrode 235 provided on the heating resistor 232, and an electrode 236 provided on the heating resistor 233.

Hereinafter, the respective portions of the heater 22 will be described in detail. In addition, the configuration of the heater 23 is the same as that of the heater 22, and thus the description thereof will be omitted.

In the present embodiment, the substrate 221 forms a quadrangle (more specifically, a rectangle) when seen in plan view. In addition, the shape of the substrate 221 when seen in plan view is not limited to a rectangle, but may be other quadrangles such as a square, a ridge shape, and a trapezoid, may be other polygons such as a triangle and a pentagon, and may be a circular shape, an oval shape, an irregular shape or the like.

The substrate 221 is provided between the heating resistor 222 and the heating resistor 223. The substrate 221 has insulation properties. As a result, it is possible to reduce the distance between the heating resistor 222 and the heating resistor 223 while preventing short-circuiting between the heating resistor 222 and the heating resistor 223. For that reason, as described later, it is possible to effectively offset the magnetic fields generated from the heating resistor 222 and the heating resistor 223.

Furthermore, the substrate 221 has a transparency to the excitation light exciting the alkali metal atoms in the gas cell 21. As a result, the heater 22 can be provided on an optical path of the excitation light. For that reason, it is possible to effectively heat the emitting portion of the excitation light of the gas cell 21 by the heater 22. In addition, in the present embodiment, as shown in FIG. 4, the excitation light is incident into the gas cell 21 via the heater 23, and is emitted from the gas cell 21 via the heater 22.

The forming material of the substrate 221 is not particularly limited if the material has the insulation properties and optical transparency as mentioned above and is able to withstand the heating of the heating resistors 222 and 223, but, for example, the glass material, crystal or the like can be used.

Furthermore, the thickness of the substrate 221 is not particularly limited, but, for example, is about 0.01 mm to 10 mm.

The heating resistor (the first resistor) 222 is provided at the gas cell 21 side of the substrate 221, and the heating resistor (the second resistor) 223 is provided at a side of the substrate 221 opposite to the gas cell 21.

The heating resistors 222 and 223 generate heat through the current flow, respectively. Furthermore, in the present embodiment, the heating resistors 222 and 223 have transparency to the excitation light exciting the alkali metal atoms in the gas cell 21, respectively. As a result, it is possible to effectively heat the emitting portion of the excitation light of the gas cell 21 by the heater 22.

Particularly, the heating resistors 222 and 223 are provided to face each other, are heated by the current flow, and mutually offset the magnetic field generated along with the current flow. As a result, even when the amount of current flow to the heater 22 (the heating resistors 222 and 223) fluctuates, a change in magnetic field in the gas cell 21 can be suppressed or prevented. For that reason, the temperature in the gas cell 21 can be kept at a desired temperature, while suppressing a change in magnetic field in the gas cell 21. As a consequence, the gas cell unit 2 is able to improve the frequency accuracy. Herein, any one of the heating resistor (the first resistor) 222 and the heating resistor (the second resistor) 223 may be a resistor (a conductor) having a resistance value close to zero, and may be a state where the heating is very low. For example, when the heating resistor (the second resistor) 223 is a resistor (a conductor) having a resistance value close to zero, it is possible to offset the magnetic field generated due to the current flow to the heating resistor (the first resistor) 222. That is, the heating resistor 222 is dedicated means for offsetting the magnetic field. In addition, in the description hereinafter, the same is also true for the relationship between the heating resistor 222 (or the first resistor) and the heating resistor 223 (or the second resistor).

To describe specifically, the heating resistor 222 is bonded to a surface of the gas cell 21 side of the substrate 221. As a result, the installation of the heating resistor 222 is easy.

Furthermore, the heating resistor 223 is bonded to an opposite side of the gas cell 21 of the substrate 221. As a result, the installation of the heating resistor 223 is easy. Furthermore, by bonding the heating resistor 222 to one surface of the substrate 221 and bonding the heating resistor 223 to the other surface of the substrate 221, it is possible to accurately regulate the distance between the heating resistor 222 and the heating resistor 223 by a thickness of the substrate 221. As a consequence, as mentioned below, when offsetting the magnetic field from the heating resistor 222 and the magnetic field from the heating resistor 223, it is possible to uniformly generate the action in the plane direction of the substrate 221.

Furthermore, the heating resistors 222 and 223 form a thin film state, respectively. As a result, it is possible to simply and accurately form the heating resistors 222 and 223 by the film formation.

In the present embodiment, the heating resistor 222 is uniformly formed over the whole region of the lower surface of the substrate 221, and the heating resistor 223 is uniformly formed over the whole region of the upper surface of the substrate 221.

The forming materials the heating resistors 222 and 223 are not particularly limited if the material is heated by the current flow and has optical transparency to the excitation light as mentioned above. However, it is desirable to use a transparent electrode material such as an oxide such as ITO (Indium Tin Oxide), IZO (Indium Zinc Oxide), In3O3, SnO2, SnO2 containing Sb, and ZnO containing Al.

Such transparent electrode materials have suitable optical transparency and can be effectively heated by the current flow.

Furthermore, when the heating resistors 222 and 223 are formed of the transparent electrode material, respectively, the heater 22 can be provided on the optical path of the excitation light. For that reason, it is possible to effectively heat the emitting portion of the excitation light of the gas cell 21 by the heater 22.

The thicknesses of the heating resistors 222 and 223 are not particularly limited, but, for example, are about 0.1 μm or more and 1 mm or less.

Furthermore, the formation of the heating resistors 222 and 223 is not particularly limited, but, for example, can be formed by the use of a plasma CVD, a chemical vapor deposition method (CVD) such as a thermal CVD, a dry plating method such as a vacuum vapor deposition, a sol-gel method or the like.

The heating resistor 222 and the heating resistor 223 are electrically connected to each other via a conductor portion 224 having conductivity.

The conductor portion 224 is provided at a side surface of the substrate 221. More specifically, the conductor portion 224 is provided along one side of the substrate 221 forming a quadrangle.

The conductor portion 224 forms a band shape extended along the Y axis direction. Moreover, the conductor portion 224 is provided over the entire regions of the heating resistors 222 and 223 in the Y axis direction. As a result, it is possible to perform the conduction between the heating resistors 222 and 223 over the entire regions in the Y axis direction in a uniform electric potential.

Furthermore, the conductor portion 224 is integrally formed with the heating resistors 222 and 223. The conductor portion 224 can be formed by the same forming material as those of the heating resistors 222 and 223, and can be formed collectively with the heating resistors 222 and 223 by the film forming method as mentioned above.

The heating resistor 222 and the heating resistor 223 are electrically connected to each other in series by the conductor portion 224.

Furthermore, the electrode 225 is provided on a surface of the heating resistor 222 opposite to the substrate 221, and the electrode 226 is provided on a surface of the heating resistor 223 opposite to the substrate 221.

The electrodes 225 and 226 are provided along a side (a left side of FIG. 5) opposite the side (a right side in FIG. 5) provided with the conductor portion 224 of the substrate 221, respectively.

The electrodes 225 and 226 form a band shape extended along the Y axis direction. Moreover, the electrode 225 is provided over the entire region of the heating resistor 222 in the Y axis direction, and the electrode 226 is provided over the entire region of the heating resistor 223 in the Y axis direction. As a result, it is possible to supply the electricity to the heating resistors 222 and 223 in a uniform electric potential over the entire region in the Y axis direction.

The forming material of the electrodes 225 and 226 is not particularly limited, but a material having excellent conductivity is suitably used, and for example, metallic materials such as aluminum, aluminum alloy, silver, silver alloy, gold, gold alloy, chrome, chrome alloy, and gold are adopted.

Furthermore, the thickness of the electrodes 225 and 226 are not particularly limited, but, for example, is about 0.1 μm or more and 1 mm or less.

Furthermore, the forming method of the electrodes 225 and 226 includes a sputtering method, a physical film forming method such as a vacuum vapor deposition method, a chemical vapor deposition method such as a CVD, and various application method such as an ink jet method.

The electrodes 225 and 226 are electrically connected to the temperature control circuit 52, and the voltage is applied between the electrode 225 and the electrode 226.

Upon applying the voltage between the electrode 225 and the electrode 226, the heating resistors 222 and 223 are supplied with the electricity, respectively.

At this time, a direction of the electric current flowing through the heating resistor 222 is opposite to a direction of the electric current flowing though the heating resistor 223 by the current flow. Specifically, the electric current flows through the heating resistor 222 from the conductor portion 224 toward the electrode 225 in the direction shown by an arrow a1 of FIG. 5, and the electric current flows through the heating resistor 223 from the electrode 226 toward the conductor portion 224 in a direction shown by an arrow a2 of FIG. 5. As a result, it is possible to mutually offset the magnetic field generated from the heating resistor 222 and the magnetic field generated from the heating resistor 223. More specifically, it is possible to offset the Z axis direction component of the magnetic field generated from the heating resistor 222 and the Z axis direction component of the magnetic field generated from the heating resistor 223. Furthermore, Y axis direction components of the magnetic field can generally offset each other.

In addition, in FIG. 5, a case is shown as an example where the electrode 225 is an anode, and the electrode 226 is a cathode, and directions (the same is also true for the directions of arrows b1 and b2) of arrows a1 and a2 may be opposite to the directions as shown.

Furthermore, in regard to the heater 23, similarly, the direction of the electric current flowing through the heating resistor 232 by the current flow and the direction of the electric current flowing through the heating resistor 233 are opposite to each other. Specifically, the electric current flows through the heating resistor 232 from the electrode 235 toward the conductor portion 234 in a direction shown by the arrow b1 of FIG. 5, and the electric current flows through the heating resistor 233 from the conductor portion 234 toward the electrode 236 in a direction shown by the arrow b2 of FIG. 5.

Furthermore, the direction of the electric current flowing through the heating resistor 222 of the heater 22 is the same as the direction of the electric current flowing through the heating resistor 232 of the heater 23. As a result, it is possible to mutually offset the magnetic fields generated from the heating resistor 222 of the heater 22 and the heating resistor 232 of the heater 23 in the gas cell 21. More specifically, it is possible to offset the Y axis component of the magnetic field generated from the heating resistor 222 and the Y axis component of the magnetic field generated from the heating resistor 232 mutually between the heating resistor 222 and the heating resistor 232.

Temperature Sensor

Furthermore, the gas cell unit 2 has the temperature sensors 24 and 25. The heating values of the heater 22 and 23 as mentioned above are controlled based on the detection results of the temperature sensors 24 and 25. As a result, it is possible to keep the alkali metal atoms in the gas cell 21 at a desired temperature.

The temperature sensor 24 detects the temperature of the heater 22 or the plate-like portion 211 of the gas cell 21. Furthermore, the temperature sensor 25 detects the temperature of the heater 23 or the plate-like portion 212 of the gas cell 21.

The installation positions of the temperature sensors 24 and 25 are not particularly limited. Although it is not shown, for example, in the temperature sensor 24, the installation position is on the heater 22 or on the vicinity of the plate-like portion 211 of the outer surface of the gas cell 21, and in the temperature sensor 25, the installation position is on the heater 23 or on the vicinity of the plate-like portion 212 of the outer surface of the gas cell 21.

As the temperature sensors 24 and 25, various known temperature sensors such as a thermistor and a thermocouple can be used, respectively, without being particularly limited.

The temperature sensors 24 and 25 are electrically connected to the temperature control circuit 52 mentioned above via a wiring (not shown).

Moreover, the temperature control circuit 52 controls the current flow amount of the heater 22 based on the detection result of the temperature sensor 24. Furthermore, the temperature control circuit 52 controls the current flow amount to the heater 23 based on the detection result of the temperature sensor 25.

In this manner, by controlling the current flow amount to the heaters 22 and 23 using the two temperature sensors 24 and 25, more precise temperature control is possible. Furthermore, it is possible to prevent an irregularity (a temperature difference between the incident side and the emitting side of the excitation light) of the temperature in the gas cell 21.

Coil

Furthermore, the gas cell unit 2 has the coil 26 (see FIG. 1).

The coil 26 generates the magnetic field by the current flow. As a result, by applying the magnetic field to the alkali metal in the gas cell 21, it is possible to expand a gap between the different degraded energy state of the alkali metal and improve the resolution. As a consequence, it is possible to increase the accuracy of the oscillation frequency of the atomic oscillator 1.

The installation position of the coil 26 is not particularly limited. Although it is not shown, the coil 26 may be provided wound along the outer periphery of the gas cell 21 so as to constitute a solenoid shape, and a pair of coils may face each other via the gas cell 21 so as to constitute a Helmholtz type.

The coil 26 is electrically connected to the magnetic field power source circuit 53 mentioned above via a wiring (not shown). As a result, it is possible to supply electricity to the coil 26.

The forming material of the coil 26 is not particularly limited, but, for example, silver, copper, palladium, platinum, gold or an alloy thereof are adopted, and one sort, or two sorts or more thereof can be used in a combined manner.

According to the gas cell unit 2 of the present embodiment as mentioned above, the heating resistors 222 and 223 of the heater 22 mutually offset the magnetic fields generated along with the current flow, and the heating resistors 232 and 233 of the heater 23 mutually offset the magnetic fields generated along with the current flow. Thus, even when the current flow amounts to the heaters 22 and 23 fluctuate, a change in magnetic field in the gas cell 21 can be suppress or prevented. For that reason, the temperature in the gas cell 21 can be kept at a desired temperature while suppressing a change in magnetic field in the gas cell 21. As a consequence, the gas cell unit 2 can improve the frequency accuracy.

Furthermore, according to the atomic oscillator 1 including the gas cell unit 2, excellent frequency accuracy is obtained.

Second Embodiment

Next, a second embodiment of the invention will be described.

Figure 6:
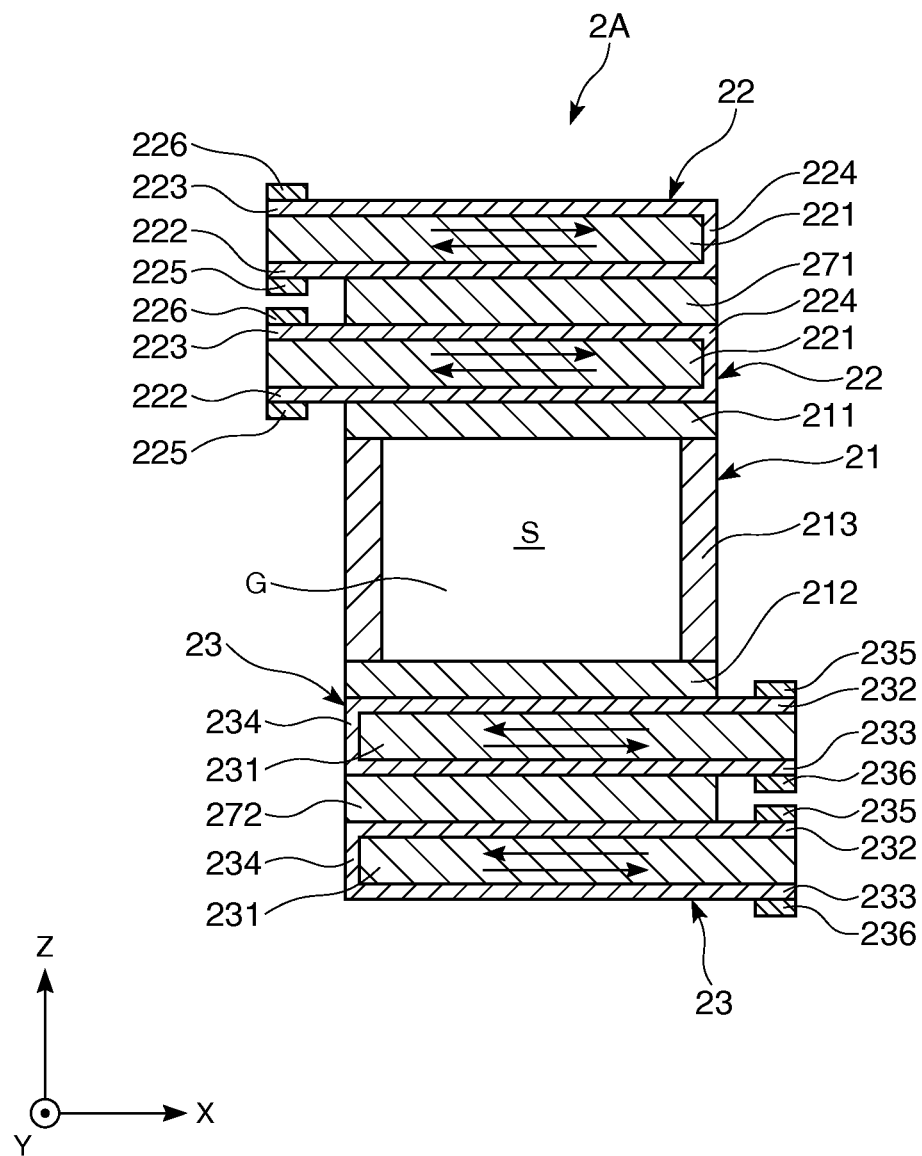
FIG. 6 is a cross-sectional view that shows a gas cell unit according to a second embodiment of the invention.

FIG. 6 is a cross-sectional view that shows a gas cell unit according to a second embodiment of the invention.

The gas cell unit according to the present embodiment is the same as that of the gas cell unit according to the first embodiment mentioned above except that the number of the heater differs.

In addition, in the description mentioned below, differences between the gas cell unit of the second embodiment and that of the first embodiment will be described, and similar matters are omitted. Furthermore, in FIG. 6, the same configurations as those of the embodiments mentioned above are denoted by the same reference numerals.

The gas cell unit 2A shown in FIG. 6 is configured so that, in the gas cell unit 2 of the first embodiment, another heater 22 is provided at a side of the heater 22 opposite to the gas cell 21 via the substrate 271, and another heater 23 is provided at a side of the heater 23 opposite to the gas cell 21 via the substrate 272.

The substrates 271 and 272 have the same configurations as those of the substrates 221 and 231 mentioned above.

The two heaters 22 are configured so that the heating resistor 222 of one (the upper side in FIG. 6) heater 22 and the heating resistor 223 of the other (the lower side of FIG. 6) heater 22 face each other via the substrate 271.

Moreover, the direction of the electric current flowing though the heating resistor 222 of the one heater 22 is opposite to the direction of the electric current flowing through the heating resistor 223 of the other heater 22. As a result, it is possible to suppress the magnetic field leaking from the two heaters 22.

Similarly, the two heaters 23 are configured so that the heating resistor 232 of one (the lower side in FIG. 6) heater 23 and the heating resistor 233 of the other (the upper side of FIG. 6) heater 23 face each other via the substrate 272.

Moreover, the direction of the electric current flowing though the heating resistor 232 of the one heater 23 is opposite to the direction of the electric current flowing through the heating resistor 233 of the other heater 23. As a result, it is possible to suppress the magnetic field leaking from the two heaters 23.

The frequency accuracy can be improved by the gas cell unit 2A according to the second embodiment as described above.

Third Embodiment

Next, a third embodiment of the invention will be described.

Figure 7:
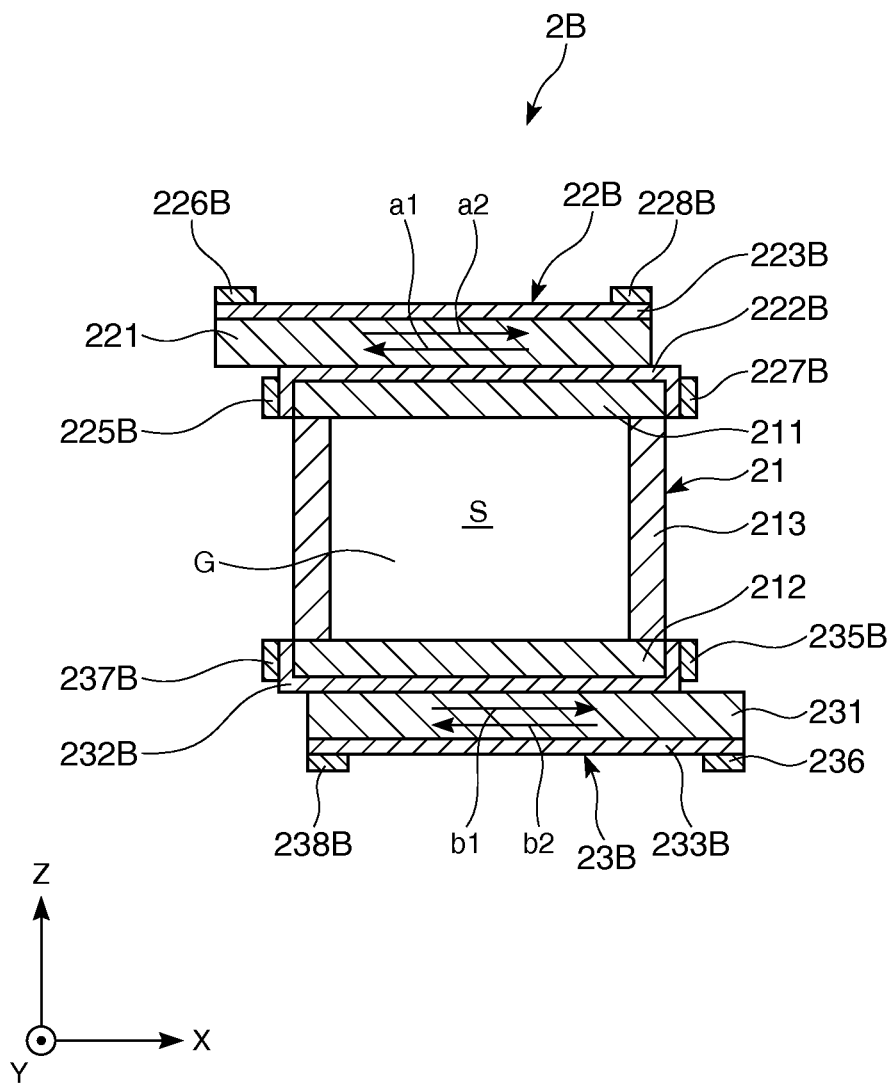
FIG. 7 is a cross-sectional view that shows a gas cell unit according to a third embodiment of the invention.

FIG. 7 is a cross-sectional view showing a gas cell unit according to the third embodiment of the invention.

The gas cell unit according to the embodiment is the same as that of the gas cell unit according to the first embodiment mentioned above except that the configuration of the heater differs.

In addition, in the description as below, differences between the gas cell unit of the third embodiment and that of the first embodiment will be mainly described, and the descriptions of similar matters will be omitted. Furthermore, in FIG. 7, the same configurations as those of the embodiments mentioned above are denoted by the same reference numerals.

A gas cell unit 2B shown in FIG. 7 has a gas cell 21, and a pair of heaters 22B and 23B provided so as to interpose the gas cell 21 therebetween.

The heater 22B has a substrate 221, a heating resistor (a first resistor) 222B provided at the gas cell 21 side (the lower side in FIG. 7) to the substrate 221, a heating resistor (a second resistor) 223B provided at an opposite side (the upper side in FIG. 7) of the gas cell 21 to the substrate 221, electrodes 225B and 227B provided on the heating resistor 222B, and electrodes 226B and 228B provided on the heating resistor 223B.

Similarly, the heater 23B has a substrate 231, a heating resistor (a first resistor) 232B provided at the gas cell 21 side (the upper side in FIG. 7) to the substrate 231, a heating resistor (a second resistor) 233B provided at an opposite side (the lower side in FIG. 7) of the gas cell 21 to the substrate 231, electrodes 235B and 237B provided on the heating resistor 232B, and electrodes 236B and 238B provided on the heating resistor 233B.

Hereinafter, the heater 22B will be described. In addition, since the heater 23B is the same as the heater 22B, the description thereof will be omitted.

The heating resistor 222B is bonded to the outer surface of the gas cell 21. More specifically, the heating resistor 222B is bonded to the outer surface of the plate-like portion 211 of the gas cell 21. As a result, it is possible to prevent a gap being generated between the heating resistor 222B and the gas cell 21. For that reason, the gas cell 21 can be uniformly and effectively heated.

Furthermore, the heating resistor 223B is bonded to the surface of the substrate 221 opposite to the gas cell 21. As a result, the installation of the heating resistor 223B is easy.

The electrodes 225B and 227B are provided on the surface of the heating resistor 222B opposite to the gas cell 21, and the electrodes 226B and 228B are provided on the surface of the heating resistor 223B opposite to the substrate 221.

The electrodes 225B and 226B are provided along one (the left side of FIG. 5) side of a pair of sides facing each other in the X axis direction of the substrate 221, respectively, and the electrodes 227B and 228B are provided along the other (the right side of FIG. 5) side of a pair of sides facing each other in the X axis direction of the substrate 221, respectively.

The electrodes 225B, 226B, 227B, and 228B form a band shape extended along the Y axis direction, respectively.

By applying the voltage between the electrode 225B and the electrode 227B, the heating resistor 222B can be supplied with electricity. Furthermore, by applying the voltage between the electrode 226B and the electrode 228B, the heating resistor 223B can be supplied with electricity.

In the heater 22B, the direction of the electric current flowing though the heating resistor 222B by the current flow is also opposite to the direction of the electric current flowing through the heating resistor 223B. Specifically, the electric current flows through the heating resistor 222B from the electrode 227B toward the electrode 225B in a direction shown by an arrow a1 of FIG. 7, and the electric current flows through the heating resistor 223B from the electrode 226B toward the electrode 228B in a direction shown by an arrow a2 of FIG. 7. As a result, it is possible to mutually offset the magnetic field generated from the heating resistor 222B and the magnetic field from the heating resistor 223B. In addition, the directions of the arrows a1 and a2 (the same is also true for the arrows b1 and b2) may be opposite to the shown directions.

The frequency accuracy can be improved by the gas cell unit 2B according to the third embodiment as mentioned above.

Fourth Embodiment

Next, a fourth embodiment of the invention will be described.

Figure 8:
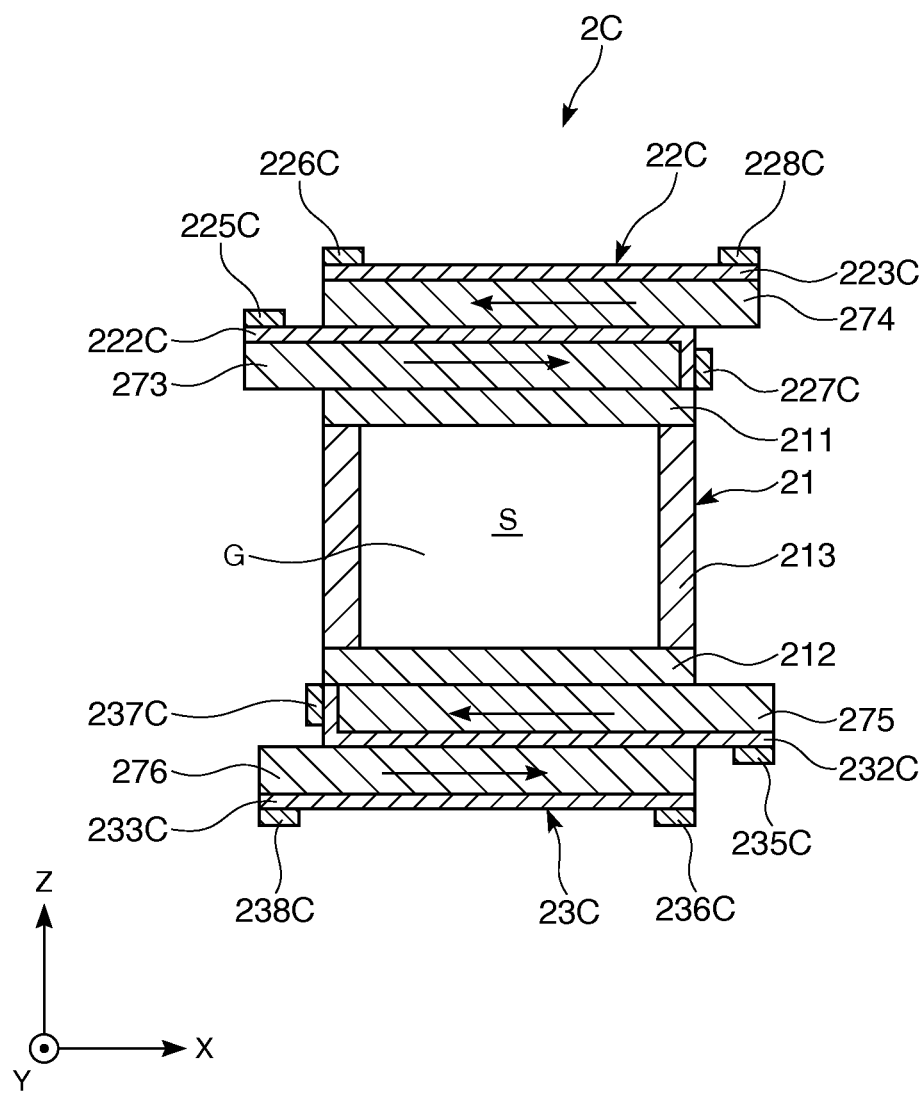
FIG. 8 is a cross-sectional view that shows a gas cell unit according to a fourth embodiment of the invention.

FIG. 8 is a cross-sectional view showing a gas cell unit according to the fourth embodiment of the invention.

The gas cell unit according to the embodiment is the same as that of the gas cell unit according to the first embodiment mentioned above except that the configuration of the heater differs.

In addition, in the description as below, differences between the gas cell unit of the fourth embodiment and that of the first embodiment will be mainly described, and the descriptions of similar matters will be omitted. Furthermore, in FIG. 8, the same configurations as those of the embodiments mentioned above are denoted by the same reference numerals.

A gas cell unit 2C shown in FIG. 8 has a gas cell 21, and a pair of heaters 22C and 23C provided so as to interpose the gas cell 21 therebetween.

The heater 22C has a substrate 273, a heating resistor (a first resistor) 222C provided on one (the upper side in FIG. 8) surface of the substrate 273, a substrate 274, a heating resistor (a second resistor) 223C provided on one (the upper side in FIG. 8) surface of the substrate 274, electrodes 225C and 227C provided on the heating resistor 222C, and electrodes 226C and 228C provided on the heating resistor 223C.

Similarly, the heater 23C has a substrate 275, a heating resistor (a first resistor) 232C provided on one (the lower side in FIG. 8) surface of the substrate 275, a substrate 276, a heating resistor (a second resistor) 233C provided on one (the upper side in FIG. 8) surface of the substrate 276, electrodes 235C and 237C provided on the heating resistor 232C, and electrodes 236C and 238C provided on the heating resistor 233C.

Hereinafter, the heater 22C will be described. In addition, since the heater 23C is the same as the heater 22C, the description thereof will be omitted.

The substrates 273 and 274 have the same configurations as those of the substrates 221 and 231 mentioned above.

The lower surface of the substrate 273 comes into contact with the upper surface of the plate-like portion 211 of the gas cell 21. Moreover, the heating resistor 222C is bonded to the upper surface of the substrate 273.

Furthermore, the lower surface of the substrate 274 comes into contact with the upper surface of the heating resistor 222C. Moreover, the heating resistor 223C is bonded to the upper surface of the substrate 274.

The electrodes 225C and 227C are provided on the surface of the heating resistor 222C opposite to the substrate 273, and the electrodes 226C and 228C are provided on the surface of the heating resistor 223C opposite to the substrate 274.

By applying the voltage between the electrode 225C and the electrode 227C, the heating resistor 222C can be supplied with electricity. Furthermore, by applying the voltage between the electrode 226C and the electrode 228C, the heating resistor 232C can be supplied with electricity.

In the heater 22C, the direction of the electric current flowing though the heating resistor 222C by the current flow is also opposite to the direction of the electric current flowing through the heating resistor 223C. Specifically, the electric current flows through the heating resistor 222C from the electrode 227C toward the electrode 225C in a direction shown by an arrow a1 of FIG. 8, and the electric current flows through the heating resistor 223C from the electrode 226C toward the electrode 228C in a direction shown by an arrow a2 of FIG. 8. As a result, it is possible to mutually offset the magnetic field generated from the heating resistor 222C and the magnetic field from the heating resistor 223C. In addition, the directions of the arrows a1 and a2 (the same is also true for the arrows b1 and b2) may be opposite to the shown directions.

Furthermore, in the present embodiment, since heat of the heating resistor 222C is transmitted to the gas cell 21 via the substrate 273, heat of the heating resistor 222C is suitably diffused until being transmitted to the space S of the gas cell 21, whereby the heating can be uniformly performed.

The frequency accuracy can be improved by the gas cell unit 2C according to the fourth embodiment as mentioned above.

Fifth Embodiment

Next, a fifth embodiment of the invention will be described.

Figure 9:
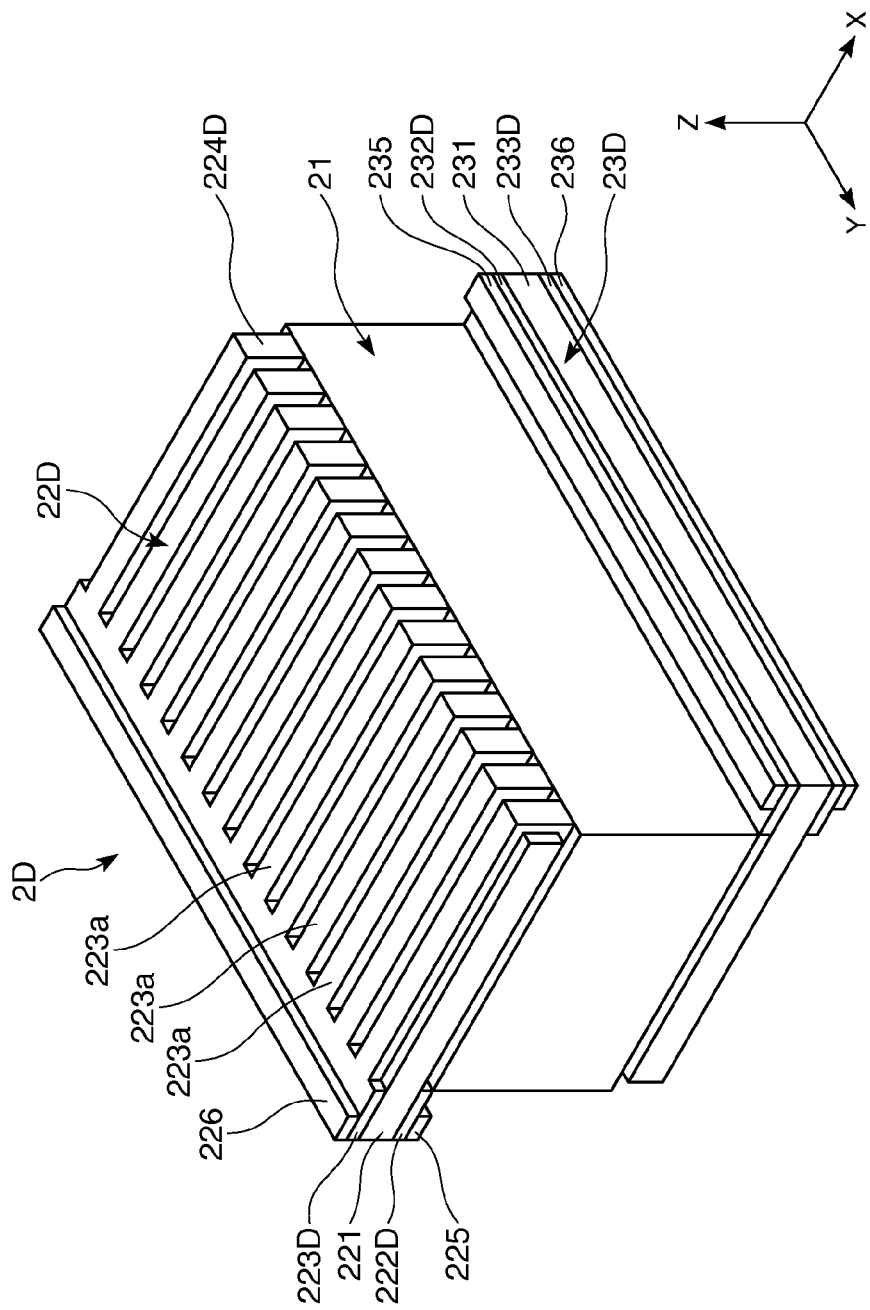
FIG. 9 is a perspective view that shows a schematic configuration of the gas cell unit according to a fifth embodiment of the invention.
Figure 10:
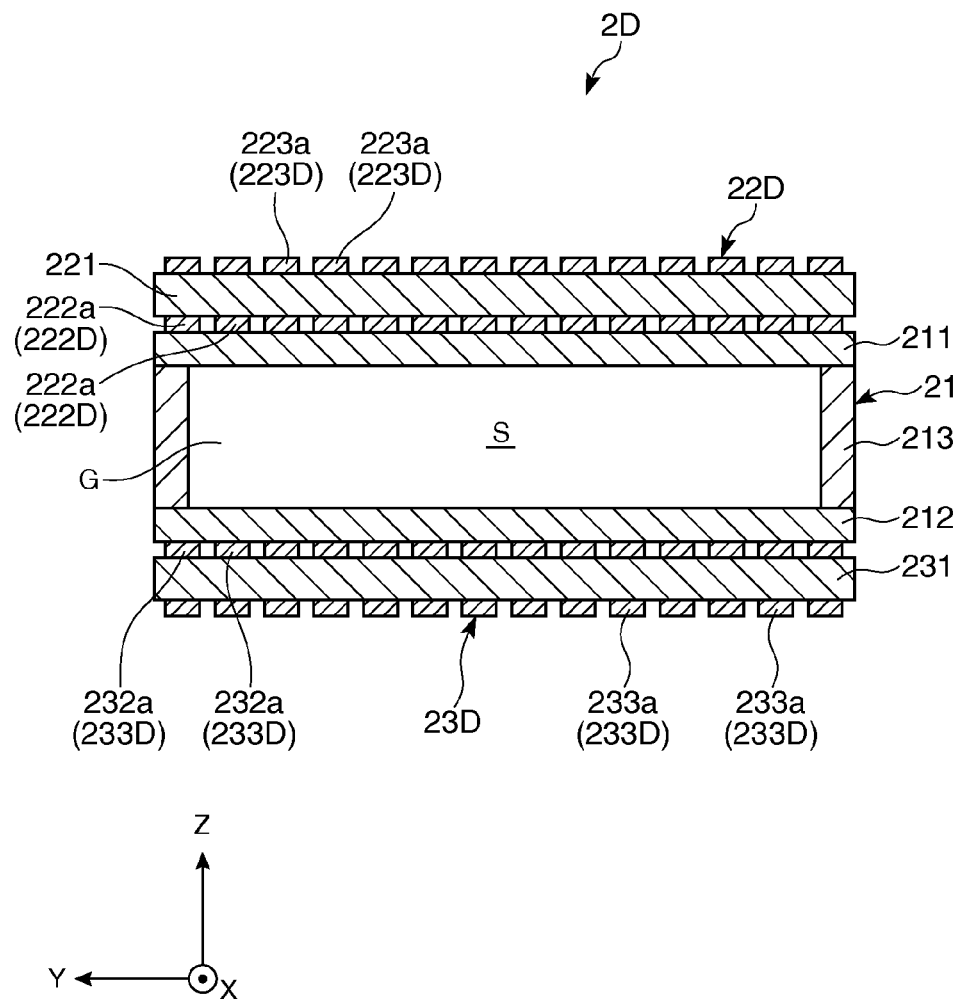
FIG. 10 is a cross-sectional view that shows the gas cell unit shown in FIG. 9.
Figure 11A:
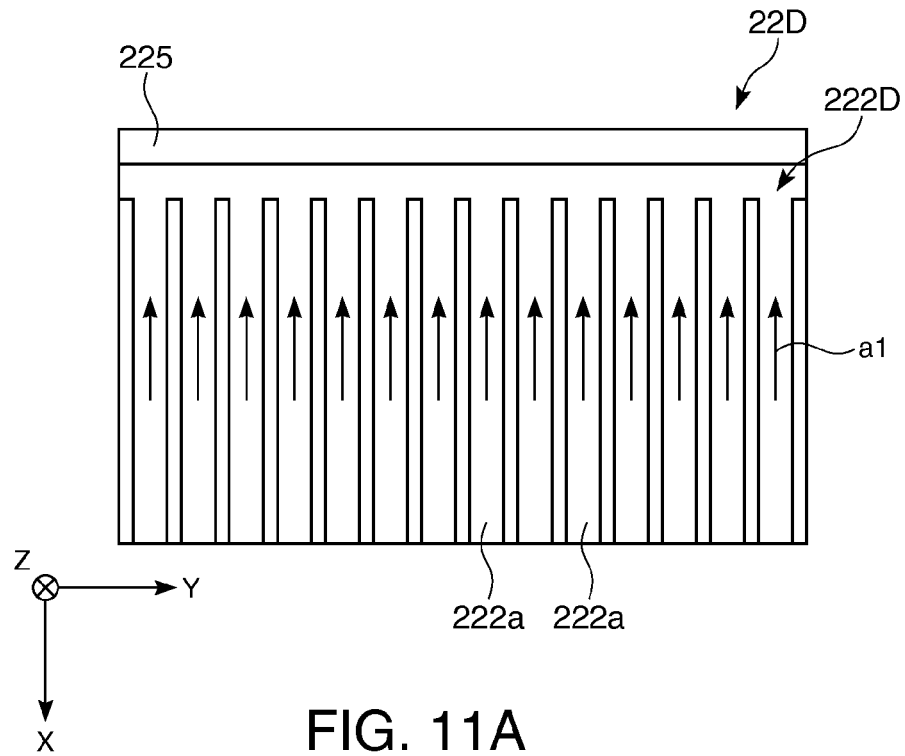
FIG. 11A is a diagram that shows a shape of the first heating resistor of the heater included in the gas cell unit shown in FIG. 9.
Figure 11B:
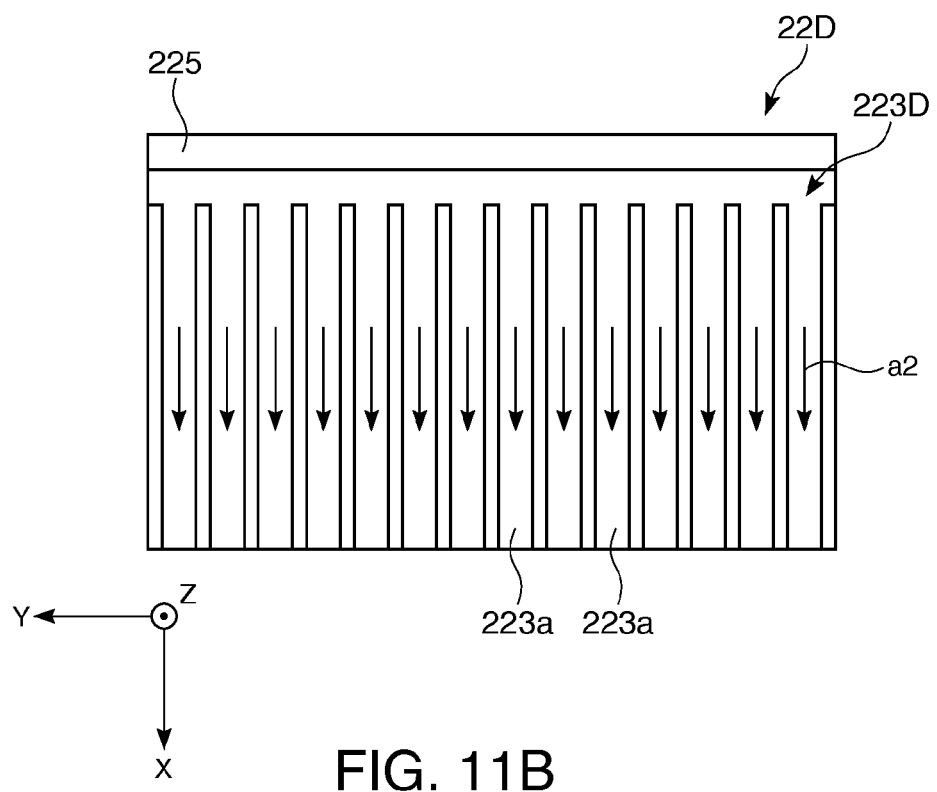
FIG. 11B is a diagram that shows a shape of the second heating resistor of the heater included in the gas cell unit shown in FIG. 9.

FIG. 9 is a perspective view that shows a schematic configuration of a gas cell unit according to the fifth embodiment of the invention. FIG. 10 is a cross-sectional view that shows the gas cell unit shown in FIG. 9. FIG. 11A is a diagram that shows the shape of a first resistor of a heater included in the gas cell unit shown in FIG. 9. FIG. 11B is a diagram that shows the shape of the second resistor of the heater included in the gas cell unit shown in FIG. 9.

The gas cell unit according to the present embodiment is the same as that of the gas cell unit according to the first embodiment mentioned above except that the configuration of the heater differs.

In addition, in the description as below, differences between the gas cell unit of the fifth embodiment and that of the first embodiment will be mainly described, and the descriptions of similar matters will be omitted. Furthermore, in FIGS. 9 to 11, the same configurations as those of the embodiments mentioned above are denoted by the same reference numerals.

A gas cell unit 2D shown in FIG. 9 has a gas cell 21, and a pair of heaters 22D and 23D provided so as to interpose the gas cell 21 therebetween.

The heater 22D has a substrate 221, a heating resistor (a first resistor) 222D provided at the gas cell 21 side (the lower side in FIG. 10) to the substrate 221, a heating resistor (a second resistor) 223D provided at an opposite side (the upper side in FIG. 10) of the gas cell 21 to the substrate 221, an electrode 225 provided on the heating resistor 222D, and an electrode 226 provided on the heating resistor 223D.

Similarly, the heater 23D has a substrate 231, a heating resistor (a first resistor) 232D provided at the gas cell 21 side (the upper side in FIG. 10) to the substrate 231, a heating resistor (a second resistor) 233D provided at an opposite side (the lower side in FIG. 10) of the gas cell 21 to the substrate 231, an electrode 235 provided on the heating resistor 232D, and an electrode 236 provided on the heating resistor 233D.

Hereinafter, the heater 22D will be described. In addition, since the heater 23D is the same as the heater 22D, the description thereof will be omitted.

The heating resistor 222D is bonded to the lower surface of the substrate 221, and the heating resistor 223D is bonded to the upper surface of the substrate 221.

The heating resistor 222D has a plurality of band-like portions 222a juxtaposed at intervals. Similarly, the heating resistor 223D has a plurality of band-like portions 223a juxtaposed at intervals.

The respective band-like portions 222a and the respective band-like portions 223a are extended along the X axis direction, respectively.

The plurality of band-like portions 222a and the plurality of band-like portions 223a correspond to each other and face each other. That is, the plurality of band-like portions 222a and the plurality of band-like portions 223a are provided so as to be symmetrical to each other via the substrate 221.

The heating resistors 222D and 223D can set a heating amount, a heating distribution or the like depending on the widths, pitches, lengths or the like of the plurality of band-like portions 222a and 223a.

The plurality of band-like portions 222a and the plurality of band-like portions 223a are electrically connected to each other via a plurality of conductor portions 224D having conductivity. In the present embodiment, the conductor portion 224D is formed integrally with the heating resistors 222D and 223D. In addition, instead of the plurality of conductor portions 224D, the conductor portion 224 of the first embodiment mentioned above may be used.

The electrodes 225 and 226 are provided along a side (the left side in FIG. 10) opposite to a side (the right side in FIG. 10) where the conductor portion 224D of the substrate 221 is provided.

By applying the voltage between the electrode 225 and the electrode 226, the heating resistors 222D and 233D can be supplied with electricity, respectively.

As shown by an arrow in FIGS. 11A and 11B, in the heater 22D, the direction of the electric current flowing through the respective band-like portions 222a of the heating resistor 222D by the current flow is opposite to the direction of the electric current flowing though the respective band-like portions 223a of the heating resistor 223D. As a result, it is possible to mutually offset the magnetic field generated from the heating resistor 222D and the magnetic field generated from the heating resistor 223D.

The frequency accuracy can be improved by the gas cell unit 2D according to the fifth embodiment as mentioned above.

Sixth Embodiment

Next, a sixth embodiment of the invention will be described.

Figure 12:
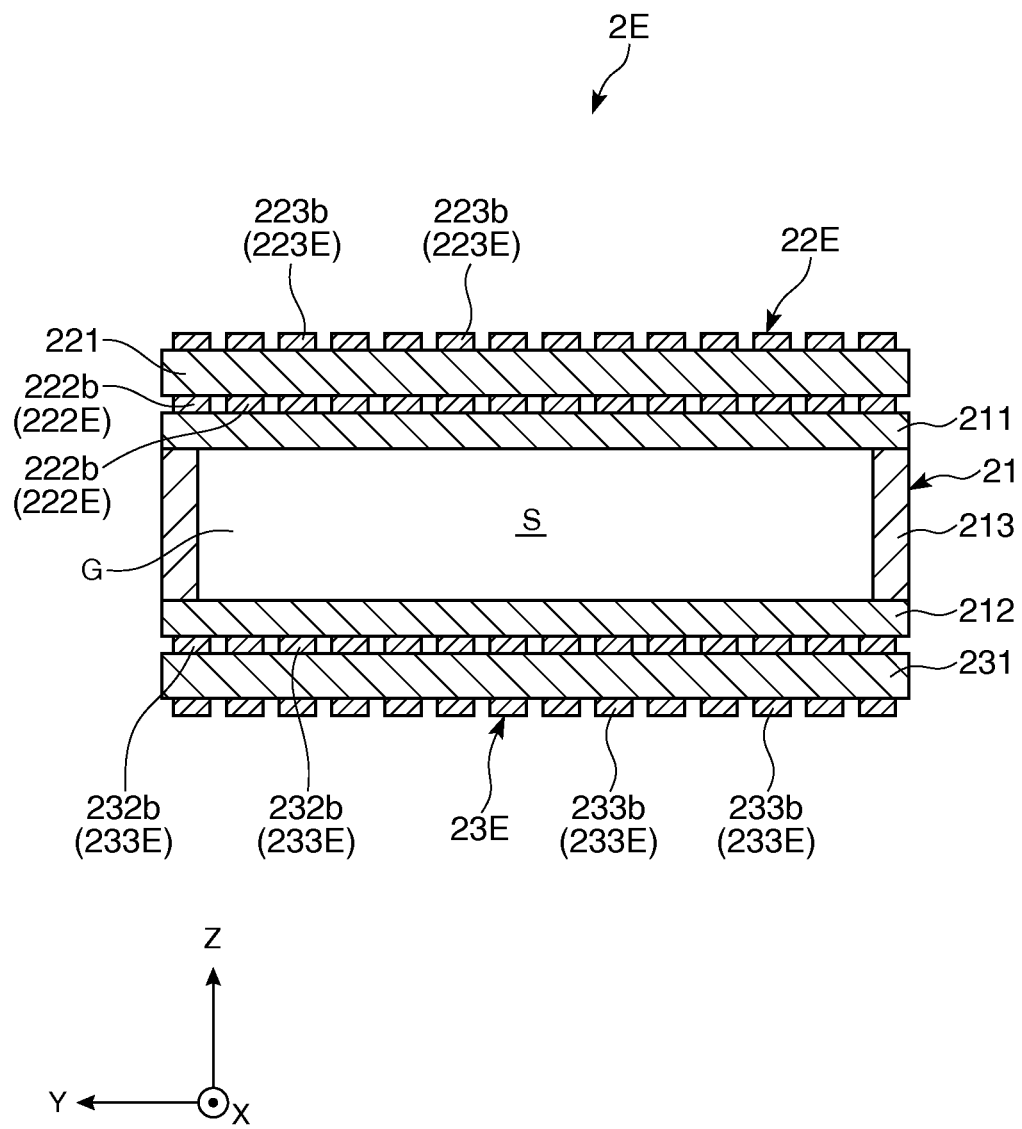
FIG. 12 is a cross-sectional view that shows a gas cell unit according to a sixth embodiment of the invention.
Figure 13A:
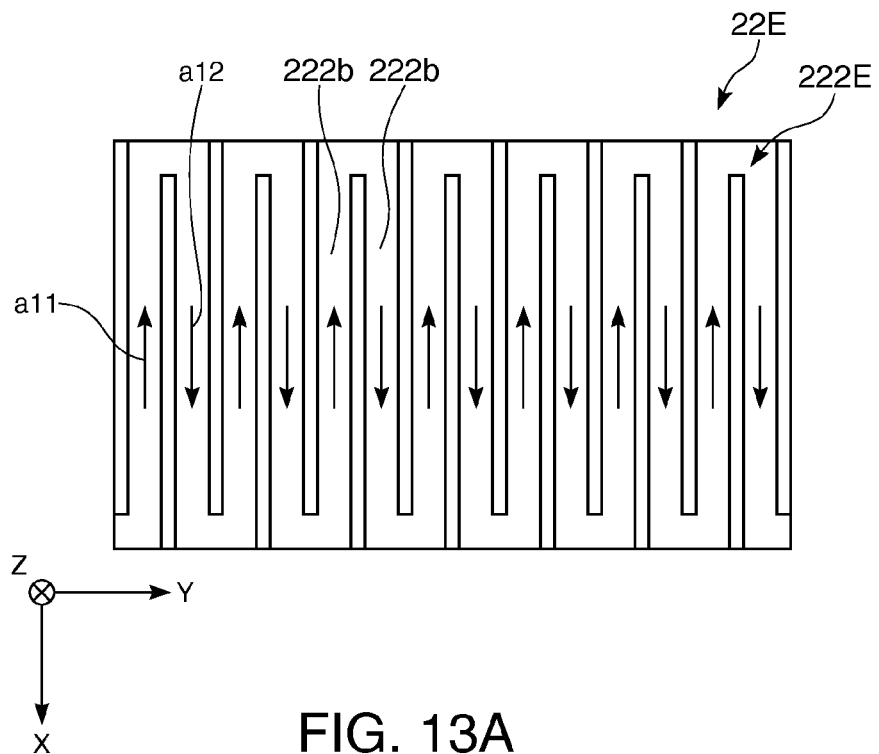
FIG. 13A is a diagram that shows a shape of the first heating resistor of the heater included in the gas cell unit shown in FIG. 12.
Figure 13B:
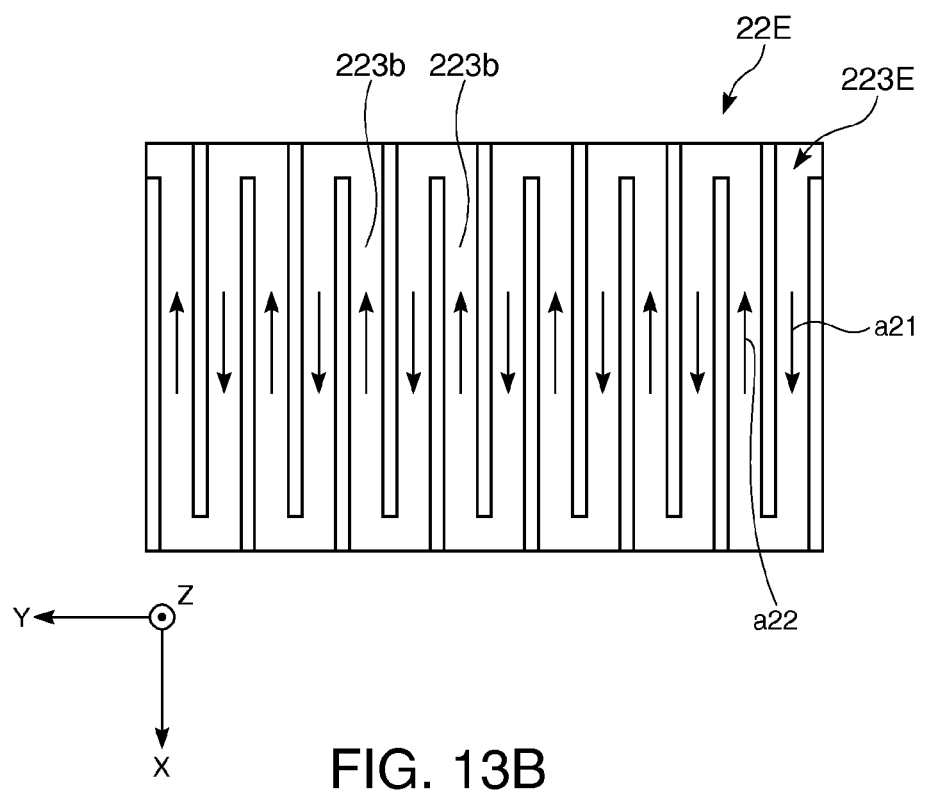
FIG. 13B is a diagram that shows a shape of the second heating resistor of the heater included in the gas cell unit shown in FIG. 12.

FIG. 12 is a cross-sectional view that shows a gas cell unit according to a sixth embodiment of the invention. FIG. 13A is a diagram of a shape of a first resistor of a heater included in the gas cell unit shown in FIG. 12. FIG. 13B is a diagram that shows a shape of a second resistor included in the gas cell unit shown in FIG. 12.

The gas cell unit according to the present embodiment is the same as that of the gas cell unit according to the first embodiment mentioned above except that the configuration of the heater differs.

In addition, in the description as below, differences between the gas cell unit of the sixth embodiment and that of the first embodiment will be mainly described, and the descriptions of similar matters will be omitted. Furthermore, in FIGS. 12, 13A and 13B, the same configurations as those of the embodiments mentioned above are denoted by the same reference numerals.

A gas cell unit 2E shown in FIG. 12 has a gas cell 21, and a pair of heaters 22E and 23E provided so as to interpose the gas cell 21 therebetween.

The heater 22E has a substrate 221, a heating resistor (a first resistor) 222E provided at the gas cell 21 side (the lower side in FIG. 12) to the substrate 221, and a heating resistor (a second resistor) 223E provided at an opposite side (the upper side in FIG. 12) of the gas cell 21 to the substrate 221.

Similarly, the heater 23E has a substrate 231, a heating resistor (a first resistor) 232E provided at the gas cell 21 side (the upper side in FIG. 12) to the substrate 231, and a heating resistor (a second resistor) 233E provided at an opposite side (the lower side in FIG. 12) of the gas cell 21 to the substrate 231.

Hereinafter, the heater 22E will be described. In addition, since the heater 23E is the same as the heater 22E, the description thereof will be omitted.

The heating resistor 222E is bonded to the lower surface of the substrate 221, and the heating resistor 223E is bonded to the upper surface of the substrate 221.

The heating resistor 222E has a plurality of band-like portions 222b juxtaposed at intervals. Similarly, the heating resistor 223E has a plurality of band-like portions 223b juxtaposed at intervals.

The respective band-like portions 222b and the respective band-like portions 223b are extended along the X axis direction, respectively.

The plurality of band-like portions 222b and the plurality of band-like portions 223b correspond to each other and face each other. That is, the plurality of band-like portions 222b and the plurality of band-like portions 223b are provided so as to be symmetrical to each other via the substrate 221.

The heating resistors 222E and 223E can set a heating amount, a heating distribution or the like depending on the widths, pitches, lengths or the like of the plurality of band-like portions 222b and 223b.

In the heater 22E, the band-like portions 222b and the band-like portions 223b facing each other via the substrate 221 are configured so that the directions of the electric current by the current flow are opposite to each other. As a result, it is possible to mutually offset the magnetic field generated from the heating resistor 222E and the magnetic field generated from the heating resistor 223E.

Furthermore, as shown by an arrow in FIGS. 13A and 13B, the heater 22E is configured so that the directions of the electric current flowing through the band-like portions 222b adjacent to each other are opposite to each other, and the directions of the electric current flowing through the band-like portions 223b adjacent to each other are opposite to each other. As a result, it is possible to mutually offset the magnetic fields generated from the band-like portions adjacent to each other. More specifically, it is possible to mutually offset the Y axis direction components of the magnetic field generated from the band-like portions 222b adjacent to each other. Furthermore, it is possible to approximately mutually offset the Z axis direction components of the magnetic field.

The frequency accuracy can be improved by the gas cell unit 2E according to the sixth embodiment as mentioned above.

The atomic oscillator as mentioned above can be built in various electronic apparatuses. Hereinafter, an application example of the electronic apparatus including the atomic oscillator according to the invention will be described.

Figure 14:
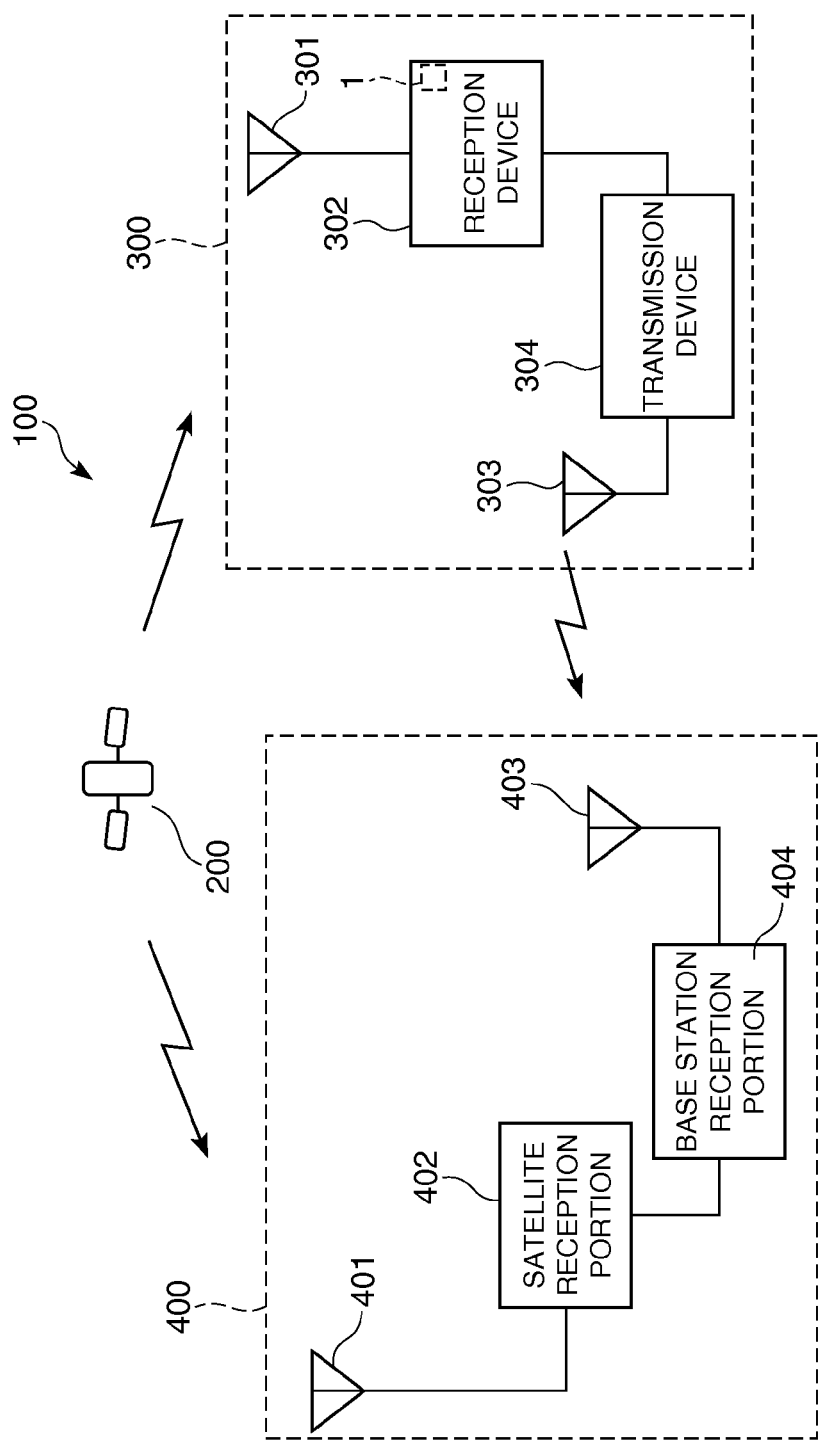
FIG. 14 is a schematic diagram of a system configuration of a case using the atomic oscillator according to the invention in a positioning system using a GPS satellite.

FIG. 14 is a system configuration schematic diagram of a case of using the atomic oscillator according to the invention in positioning system using a GPS satellite.

A positioning system 100 shown in FIG. 14 includes a GPS satellite 200, a base station apparatus 300, and a GPS receiving apparatus 400.

The GPS satellite 200 receives positioning information (a GPS signal).

The base station apparatus 300 includes, for example, a receiving apparatus 302 which accurately receives the positioning information from the GPS satellite 200 via an antenna 301 provided in an electronic reference point (a GPS continuous observation station), and a transmitting apparatus 304 which transmits the positioning information received from the receiving apparatus 302 via an antenna 303.

Herein, the receiving apparatus 302 is an electronic apparatus which includes the atomic oscillator 1 according to the invention mentioned above as a reference frequency oscillation source. The receiving apparatus 302 has excellent reliability. Furthermore, the positioning information received by the receiving apparatus 302 is transmitted by the transmitting apparatus 304 in real time.

The GPS receiving apparatus 400 includes a satellite receiving portion 402 which the positioning information from the GPS satellite 200 via an antenna 401, and a base station receiving portion 404 which receives the positioning information from the base station apparatus 300 via an antenna 403.

As mentioned above, the gas cell unit, the atomic oscillator, and the electronic apparatus according to the invention have been described based on the shown embodiments, but the invention is not limited thereto.

Furthermore, in the gas cell unit and the atomic oscillator according to the invention, the configurations of each portion can be substituted for an arbitrary configuration exhibiting the same function, and an arbitrary configuration can also be added.

Furthermore, in the gas cell unit and the atomic oscillator according to the invention, arbitrary configurations of the respective embodiments mentioned above may be combined with each other.

For example, in the embodiment mentioned above, a case has been described where two heaters (the first heater and the second heater) included in the gas cell unit have the same configuration, but in a case where the gas cell unit has two heaters, one heater and the other heater may have different configurations.

Furthermore, any one of the heaters 22 and 23 may be omitted depending on the size of the gas cell 21, the type of the use alkali metal, the heating amount or the like of the heater or the like. Furthermore, the number of heaters included in the gas cell unit may be three, or five or more.

Furthermore, in the embodiment mentioned above, a case has been described where two temperature sensors are provided, but the number of temperature sensors may be one, and three or more.

The entire disclosure of Japanese Patent Application No. 2011-055656, filed Mar. 14, 2011 is expressly incorporated by reference herein.

What is claimed is:

1. A gas cell unit comprising:
    a gas cell;
    a first heater which has a first resistor and a second resistor and heats the gas cell, wherein the first resistor and the second resistor are connected to each other, the first resistor and the second resistor are placed on a surface of the gas cell in a superimposed manner, and a direction of electric current flowing through the first resistor is opposite to a direction of electric current flowing through the second resistor; and
    a second heater having the same configuration as that of the first heater,
    wherein the gas cell unit has a configuration in which the gas cell is interposed between the first heater and the second heater.

2. The gas cell unit according to claim 1,
    wherein the first heater or the second heater has a substrate, the first resistor and the second resistor are provided on one surface side and the other surface side of the substrate, respectively, and the first resistor comes into contact with the surface of the gas cell.

3. The gas cell unit according to claim 2,
    wherein the first resistor is bonded to one surface of the substrate, and the second resistor is bonded to the other surface of the substrate.

4. The gas cell unit according to claim 2,
wherein the first resistor is bonded to the surface of the gas cell, and the second resistor is bonded to the other surface of the substrate.

5. The gas cell unit according to claim 2,
wherein a direction of electric current flowing through the first resistor of the first heater is the same as a direction of electric current flowing through the first resistor of the second heater.

6. The gas cell unit according to claim 2,
wherein the first and the second resistors have a configuration having a plurality of band-like portions, and the band-like portions are juxtaposed at intervals.

7. The gas cell unit according to claim 6,
wherein the plurality of band-like portions is configured so that directions of the electric currents flowing through the band-like portions adjacent to each other are opposite to each other.

8. An atomic oscillator comprising:
the gas cell unit according to claim 1;
a light emitting portion which emits an excitation light exciting alkali metal atoms in the gas cell; and
an optical detecting portion which detects the intensity of the excitation light transmitted through the gas cell.

9. An electronic apparatus comprising the atomic oscillator according to claim 8.

* * * * *